(12) United States Patent
Matsuda

(10) Patent No.: US 12,200,919 B2
(45) Date of Patent: Jan. 14, 2025

(54) LAMINATE, COATING MEMBER HAVING SAME, AND LAMINATE MANUFACTURING METHOD

(71) Applicant: FUJIKO CO., LTD., Kagawa (JP)

(72) Inventor: Yasushi Matsuda, Kagawa (JP)

(73) Assignee: FUJIKO CO., LTD., Kagawa (JP)

( * ) Notice: Subject to any disclaimer, the term of this patent is extended or adjusted under 35 U.S.C. 154(b) by 290 days.

(21) Appl. No.: 17/631,421

(22) PCT Filed: Oct. 9, 2020

(86) PCT No.: PCT/JP2020/038330
§ 371 (c)(1),
(2) Date: Jan. 28, 2022

(87) PCT Pub. No.: WO2021/070940
PCT Pub. Date: Apr. 15, 2021

(65) Prior Publication Data
US 2022/0279688 A1    Sep. 1, 2022

(30) Foreign Application Priority Data
Oct. 10, 2019   (JP) ................. 2019-186994

(51) Int. Cl.
| H05K 9/00 | (2006.01) |
| B32B 5/02 | (2006.01) |
| B32B 9/00 | (2006.01) |
| B32B 9/04 | (2006.01) |
| B32B 27/12 | (2006.01) |
| B32B 29/00 | (2006.01) |
| C09D 1/00 | (2006.01) |

(Continued)

(52) U.S. Cl.
CPC ............ *H05K 9/0088* (2013.01); *B32B 5/02* (2013.01); *B32B 9/007* (2013.01); *B32B 9/047* (2013.01);

(Continued)

(58) Field of Classification Search
CPC ........ H05K 9/00–9/0098; B32B 1/00–2607/02
See application file for complete search history.

(56) References Cited

U.S. PATENT DOCUMENTS

| 2010/0206504 A1* | 8/2010 | Akiyama ............... D21H 21/14 |
| | | 977/734 |
| 2015/0299955 A1 | 10/2015 | Laukkanen et al. |
| 2017/0043565 A1* | 2/2017 | Fushimi .................. B32B 15/18 |

FOREIGN PATENT DOCUMENTS

| JP | 2016501926 A | 1/2016 |
| JP | 2017-128034 A | 7/2017 |

(Continued)

OTHER PUBLICATIONS

Machine translation of WO 2014/200035. Retrieved Apr. 17, 2024.*

(Continued)

*Primary Examiner* — Prashant J Khatri
(74) *Attorney, Agent, or Firm* — HAUPTMAN HAM, LLP

(57) ABSTRACT

A laminate in which a carbon nanotube layer is stably laminated; a coating member having the same; and a laminate manufacturing method are provided. This laminate includes: an insulating layer that mainly contains a resin composition; a cellulose fiber layer that is laminated on the insulating layer and mainly contains a microfibrous cellulose having a fiber width of 1000 nm or smaller; and a carbon nanotube layer that is laminated on the cellulose fiber layer and mainly contains carbon nanotubes.

11 Claims, 10 Drawing Sheets

(51) Int. Cl.
  *C09D 5/32* (2006.01)
  *C09D 7/40* (2018.01)
  *C09D 101/02* (2006.01)
  *H01Q 17/00* (2006.01)

(52) U.S. Cl.
  CPC ............ *B32B 27/12* (2013.01); *B32B 29/002* (2013.01); *C09D 1/00* (2013.01); *C09D 5/32* (2013.01); *C09D 7/70* (2018.01); *C09D 101/02* (2013.01); *H01Q 17/002* (2013.01); *B32B 2255/10* (2013.01); *B32B 2262/062* (2013.01); *B32B 2307/102* (2013.01); *B32B 2307/212* (2013.01); *B32B 2307/732* (2013.01)

(56) References Cited

FOREIGN PATENT DOCUMENTS

| | | |
|---|---|---|
| JP | 2017123303 A | 7/2017 |
| JP | 2018195854 A | 12/2018 |
| WO | 2010113303 A1 | 10/2010 |
| WO | WO-2014200035 A1 * 12/2014 ........... H05K 9/0088 |

OTHER PUBLICATIONS

Zhang et al. "Tunable electromagnetic interference shielding effectiveness via multilayer assembly of regenerated cellulose as a supporting substrate and carbon nanotubes/polymer as a functional layer", J. Mater. Chem. C, 5, (2017); pp. 3130-3138.*

Lee et al. "Carbon nanotube/cellulose papers with high performance in electric heating and electromagnetic interference shielding", Composites Science and Technology, 131, (2016); pp. 77-87.*

"Cellulose". https://pubchem.ncbi.nlm.nih.gov/compound/Cellulose. Retrieved Apr. 16, 2024.*

International Search Report in PCT Application No. PCT/JP2020/038330, mailed Dec. 28, 2020, 4pp.

Office Action in CN Application No. 202080032586.3 mailed Oct. 8, 2024, 22pp.

* cited by examiner

[Fig.1]
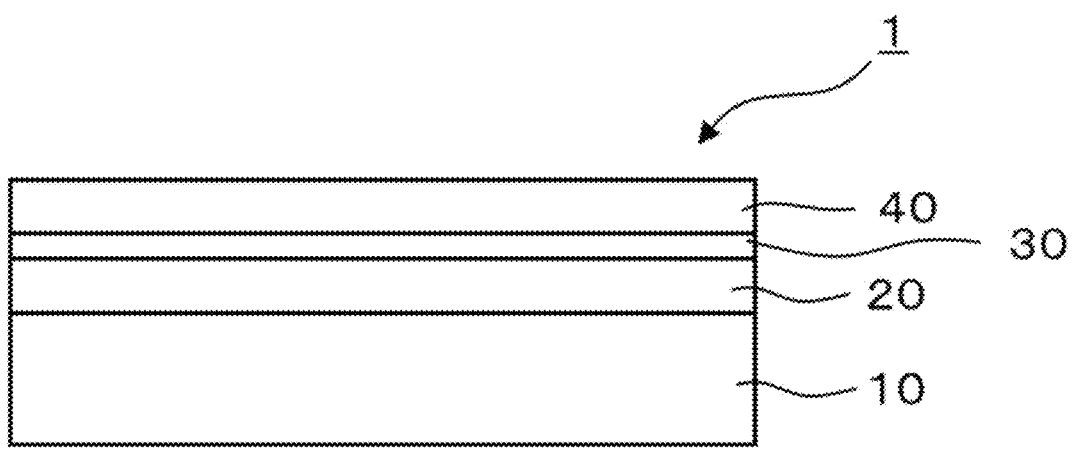

[Fig.2]
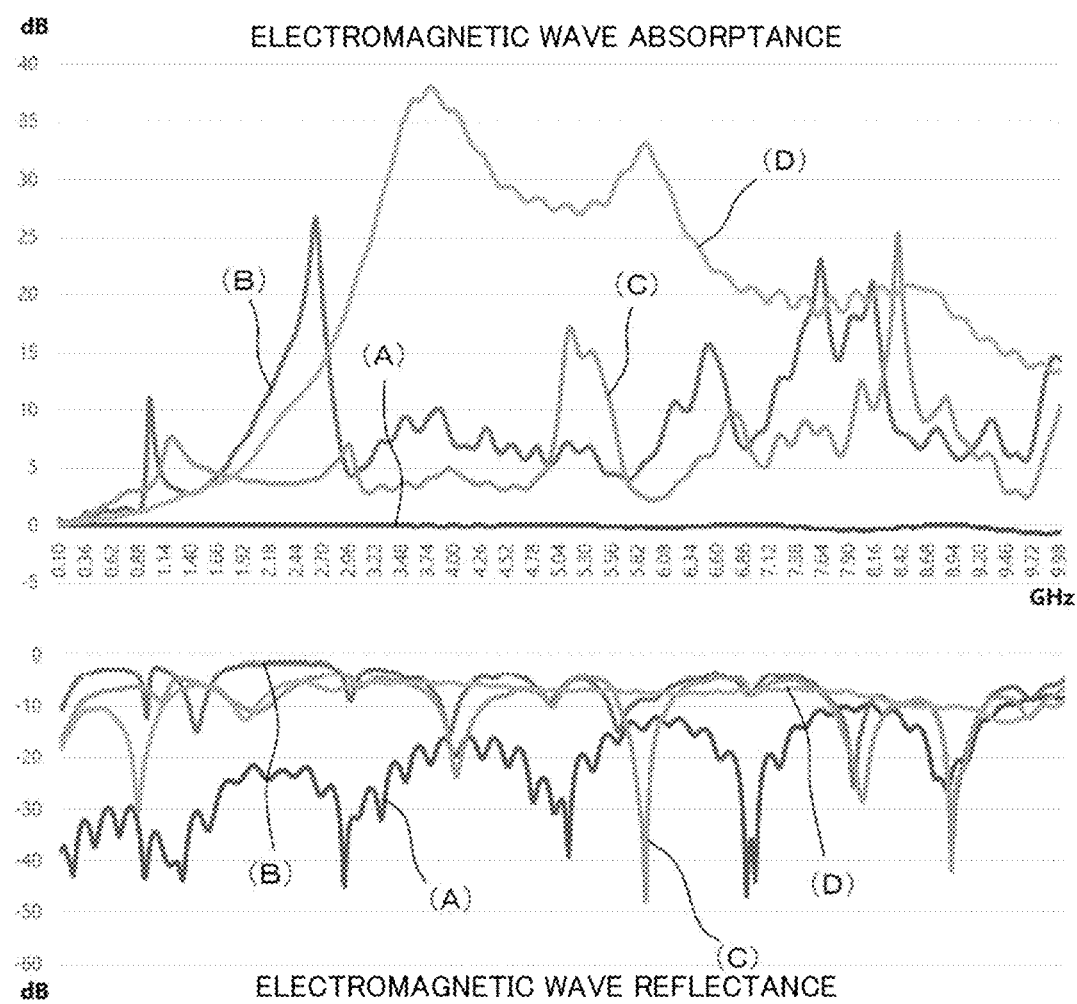

[Fig.3]
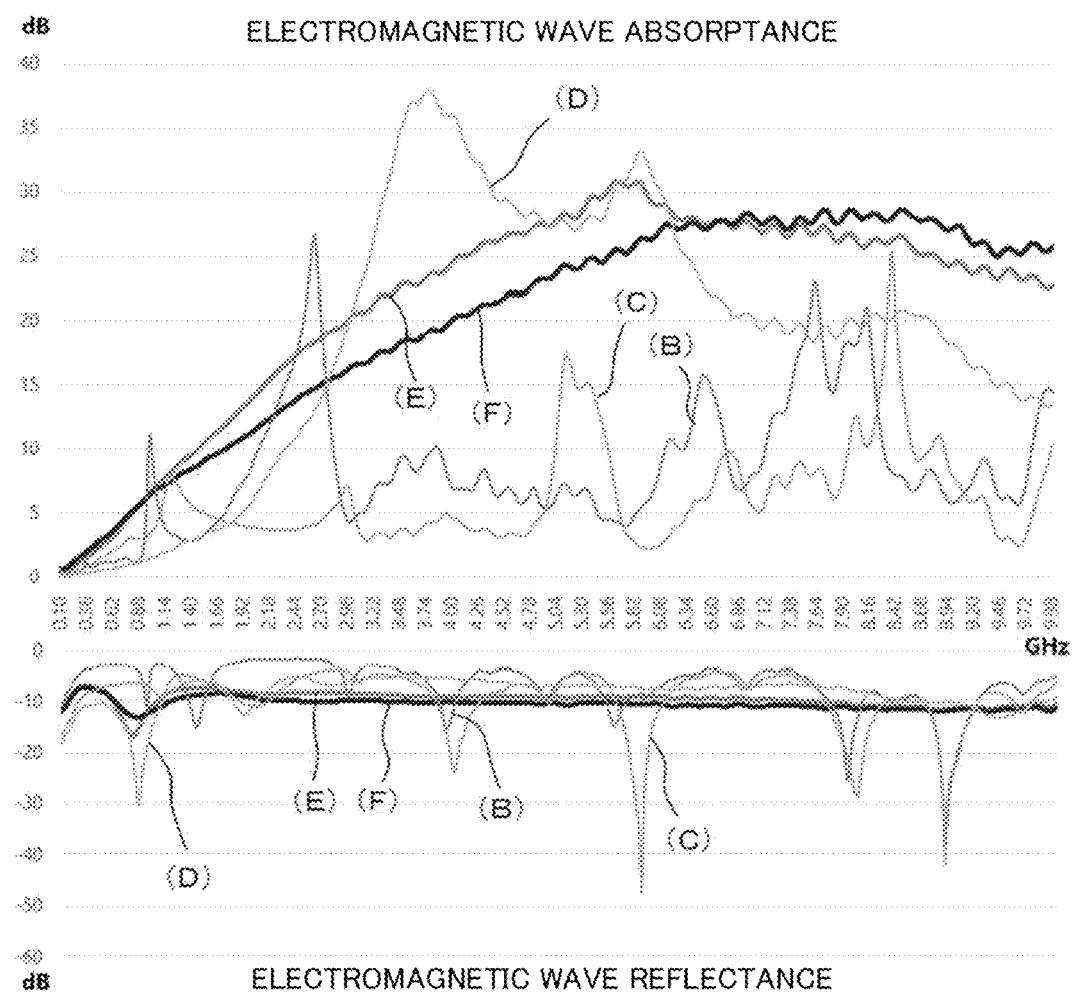

[Fig.4]
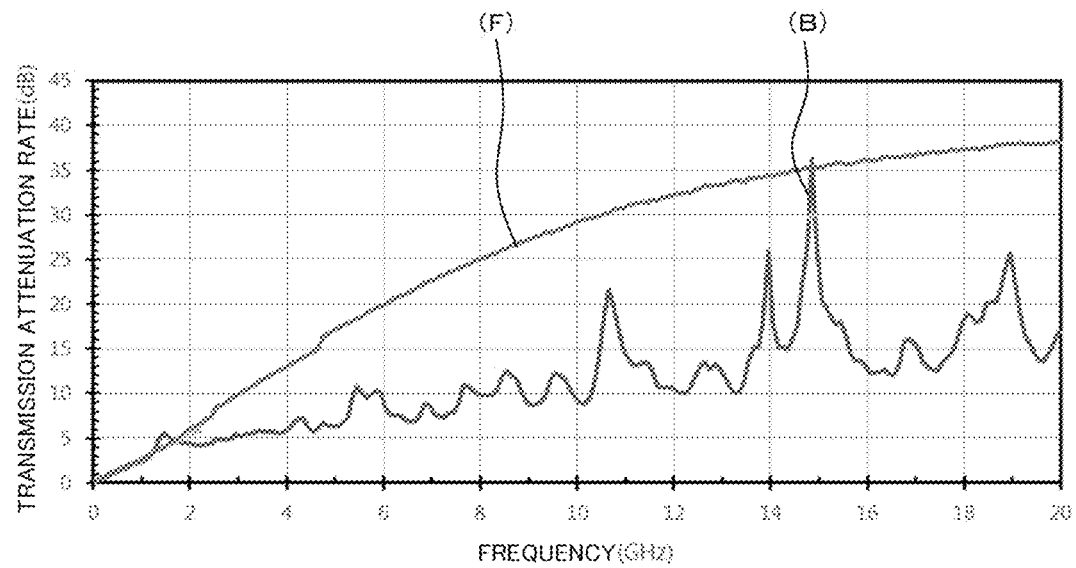
[Fig.5]
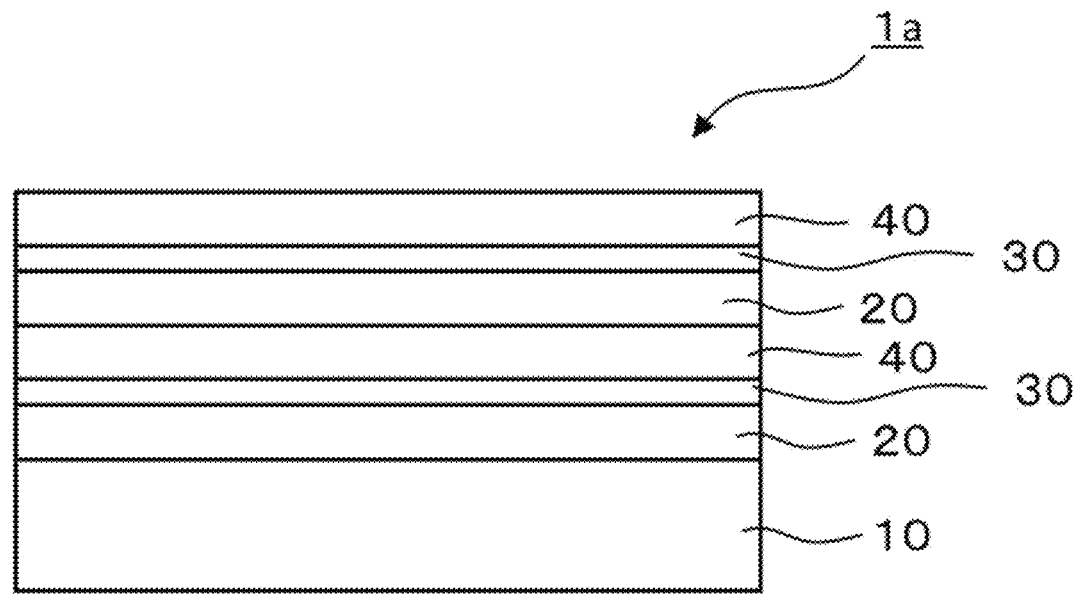

[Fig.6]
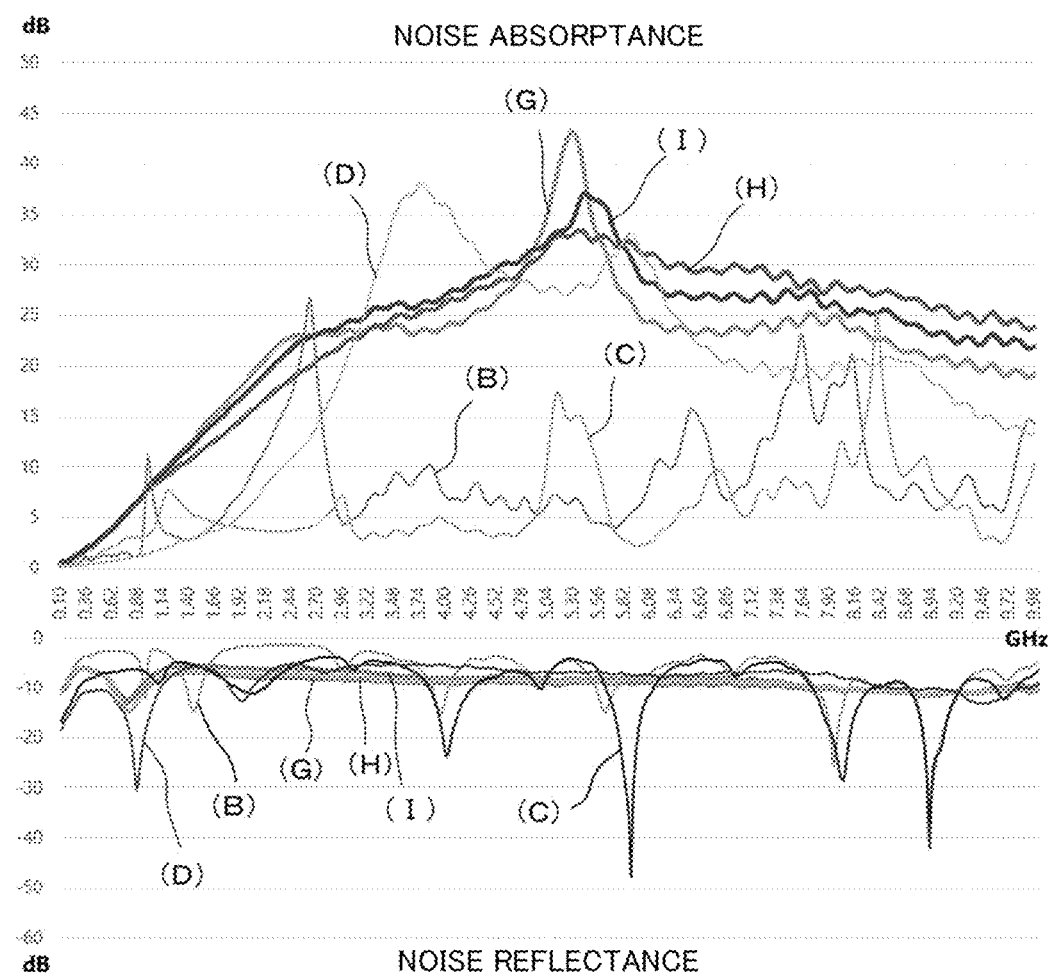

[Fig.7]
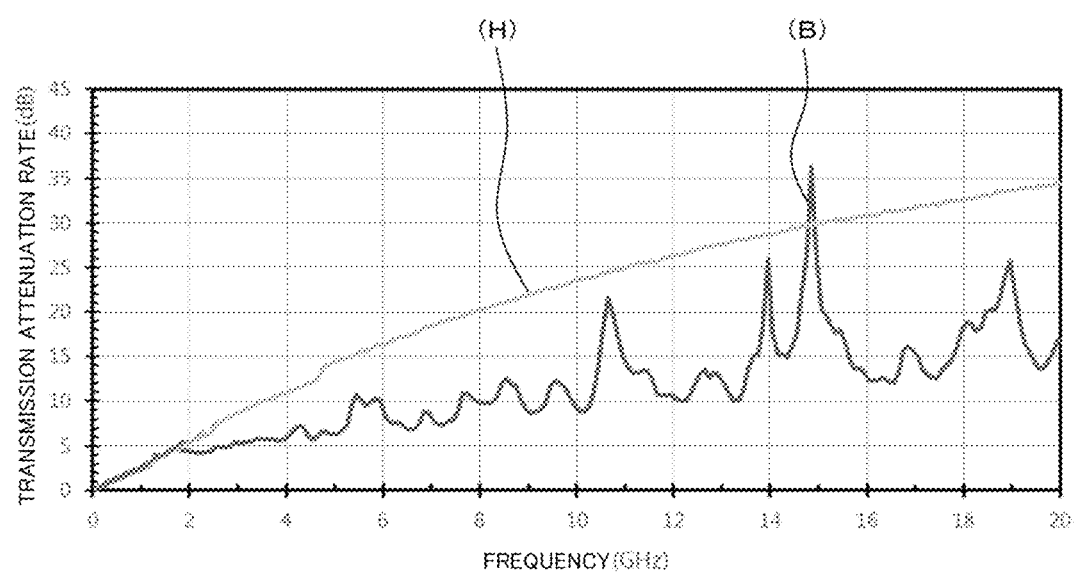

[Fig. 8A]
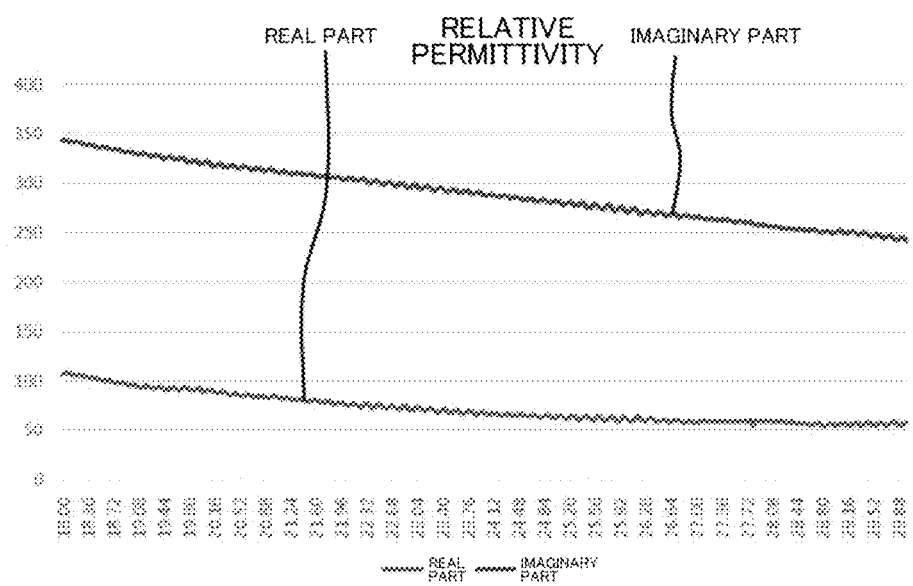
[Fig. 8B]
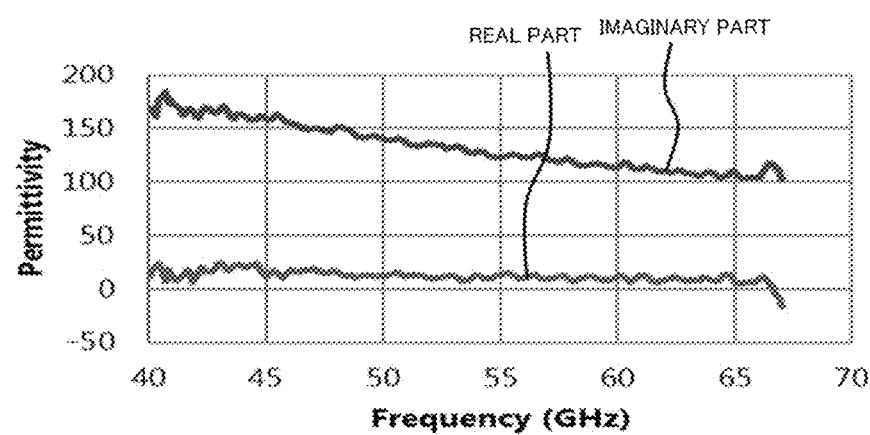

[Fig.9]
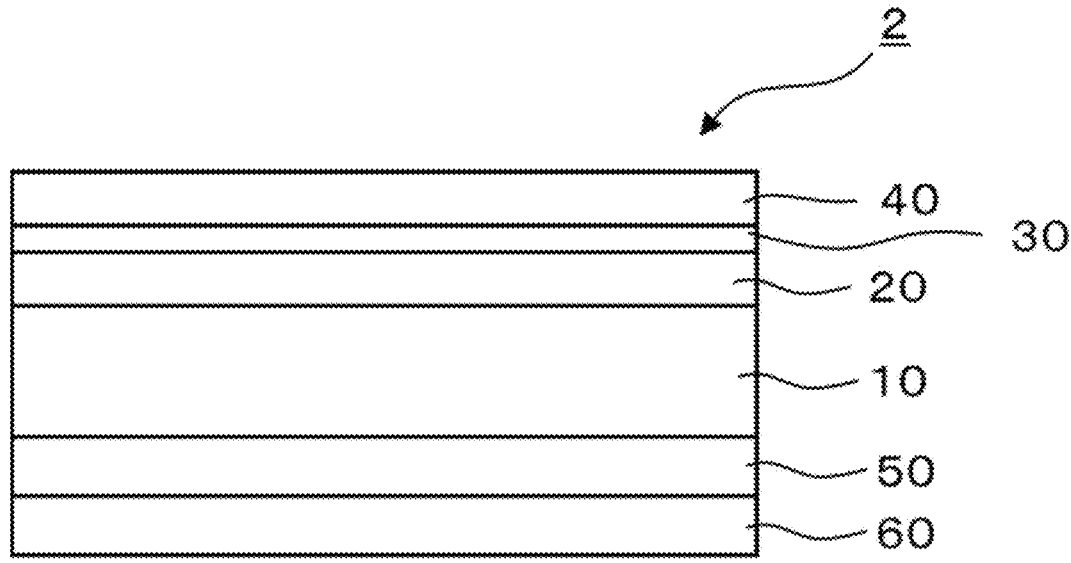
[Fig.10]
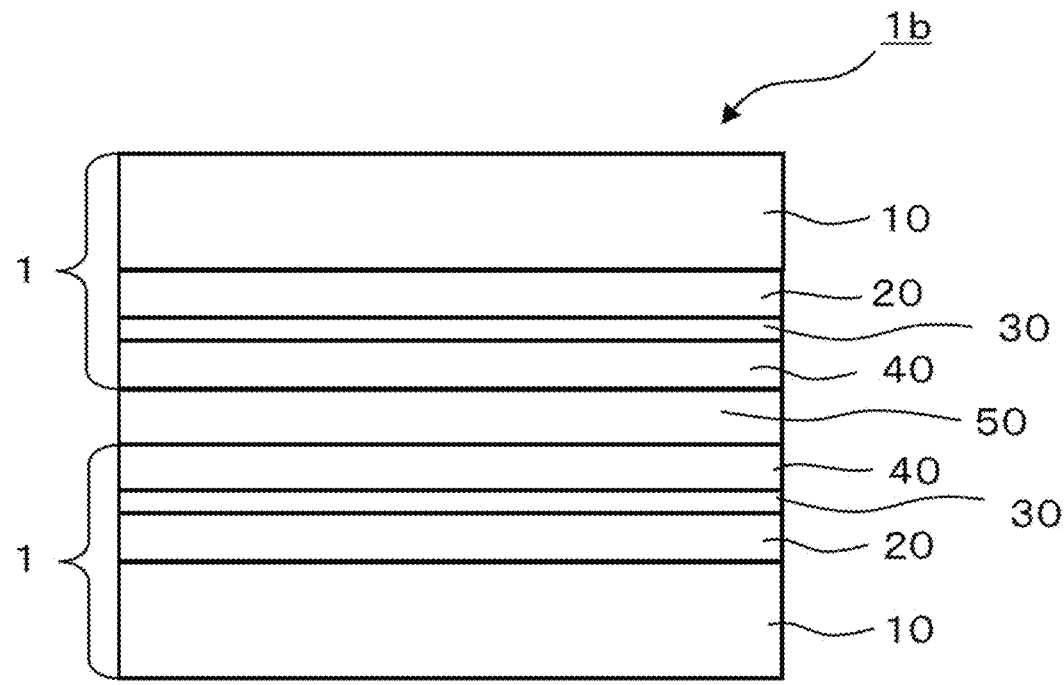

[Fig.11]
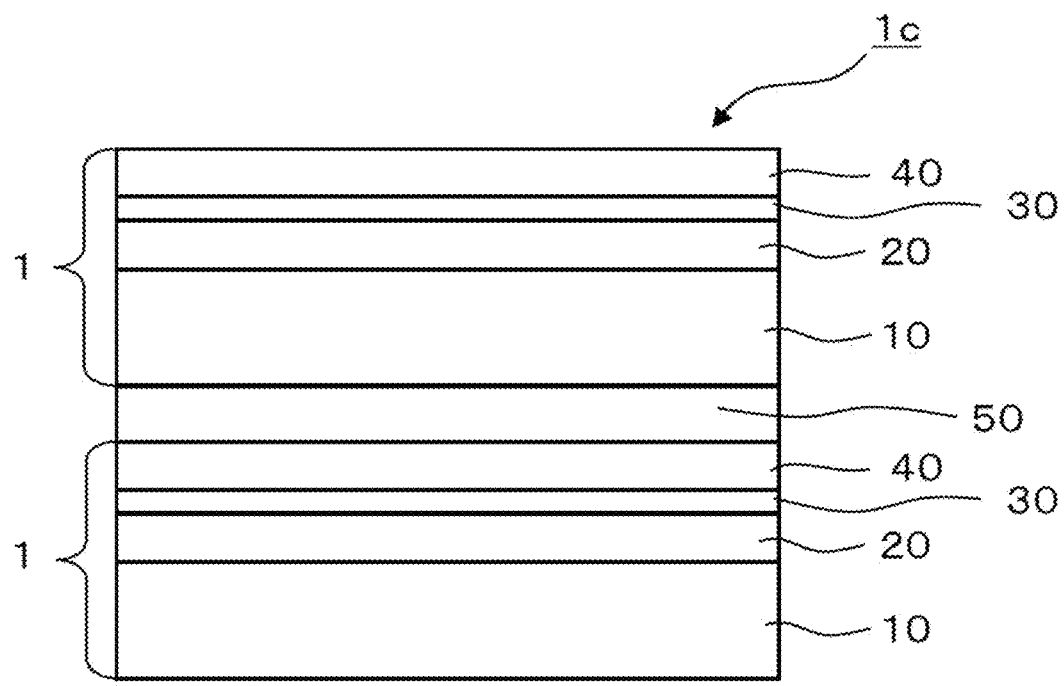

[Fig. 12A]
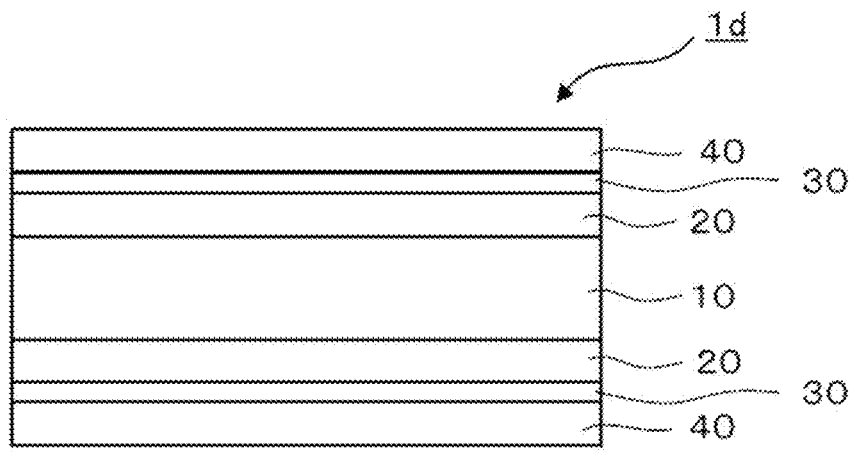
[Fig. 12B]
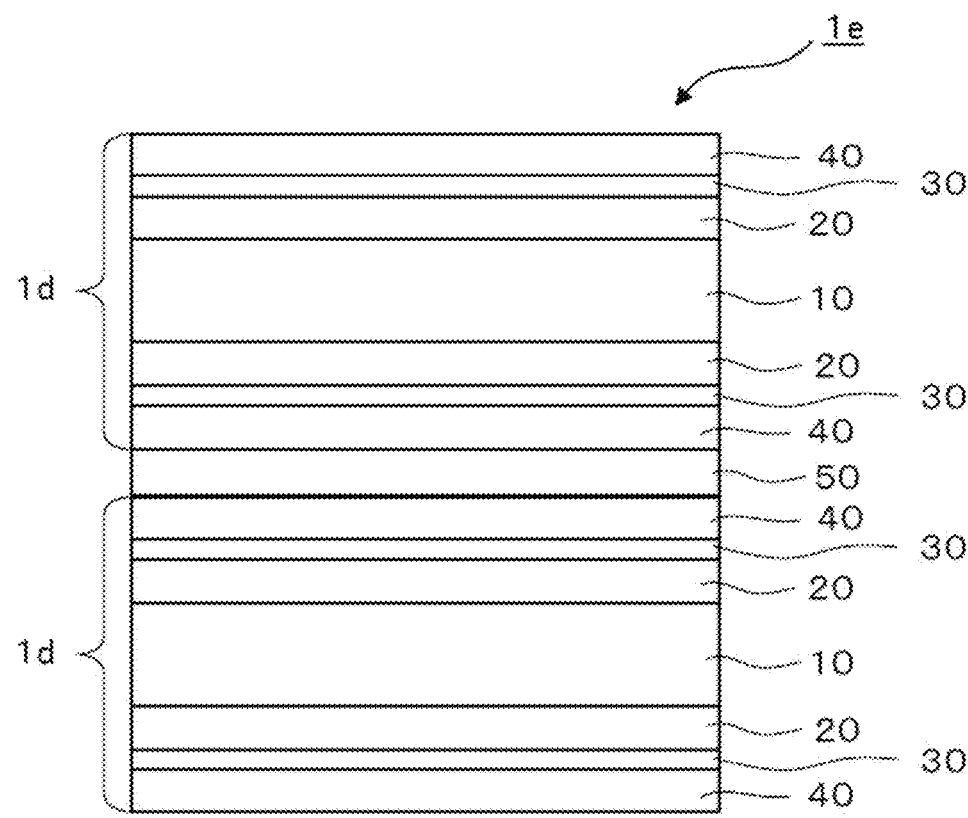

LAMINATE, COATING MEMBER HAVING SAME, AND LAMINATE MANUFACTURING METHOD

RELATED APPLICATIONS

The present application is a National Phase of International Application No. PCT/JP2020/038330 filed Oct. 9, 2020, and claims priority based on Japanese Patent Application No. 2019-186994 filed Oct. 10, 2019.

TECHNICAL FIELD

The present invention relates to a laminate having a layer constituted of carbon nanotubes, a coating member, and a laminate manufacturing method.

BACKGROUND ART

In the related art, a laminate obtained, in order to reduce noise such as electromagnetic waves, by a metal thin film such as copper or aluminum or a metal thin film containing ferritic metal powder being laminated on a flexible insulating layer such as a polyethylene resin has been known. However, the laminate obtained by using the metal thin film has a problem that a thickness of the laminate is as thick as 100 μm or greater and the use is limited. Therefore, in recent years, a laminate (noise suppression sheet) having a thickness reduced by a carbon nanotube layer as a conductive substance being laminated on the insulating layer has been developed (for example, see Patent Literatures 1 and 2).

CITATION LIST

Patent Literatures

Patent Literature 1: Japanese Patent Application Laid-Open No. 2017-123303
Patent Literature 2: Japanese Patent Application Laid-Open No. 2018-195854

SUMMARY

Technical Problem

In order to improve noise suppression performance of the laminate, a layer formed of a single carbon nanotube is preferably laminated on the flexible insulating layer such as a polyethylene resin as described in Patent Literature 1, rather than the carbon nanotube layer is formed as a layer obtained by carbon nanotubes and resin being mixed as described in Patent Literature 2. However, since a surface of each carbon nanotube is rich in negatively charged pi-electrons, electrical repulsion may occur in a case where the carbon nanotubes are laminated on a resin whose surface is also negatively charged, or the carbon nanotubes may agglomerate during drying, and there is a problem that the adhesion between the carbon nanotubes and the insulating layer decreases, and holes (recesses) and flat-grain (patterns) are formed, so that a stable laminate cannot be obtained.

An object of the present invention is to provide a laminate in which a carbon nanotube layer is stably laminated; a coating member having the same; and a laminate manufacturing method.

Solution to Problem

A laminate according to the present invention includes: an insulating layer that mainly contains a resin composition; a cellulose fiber layer that is laminated on the insulating layer and mainly contains a microfibrous cellulose having a fiber width of 1000 nm or smaller; and a carbon nanotube layer that is laminated on the cellulose fiber layer and mainly contains carbon nanotubes.

In the laminate, a film thickness of the carbon nanotube layer may be 20 μm or smaller, and a film thickness of the entire laminate may be 120 μm or smaller.

In the laminate, the carbon nanotube layer may be formed by using water-dispersed carbon nanotubes.

In the laminate, a cellulose fiber layer that mainly contains a microfibrous cellulose may be further laminated on the carbon nanotube layer, and a carbon nanotube layer that mainly contains carbon nanotubes may be further laminated on the cellulose fiber layer.

In the laminate, an insulating layer that mainly contains a resin composition may be laminated on the carbon nanotube layer, a cellulose fiber layer that mainly contains a microfibrous cellulose may be further laminated on the insulating layer, and a carbon nanotube layer that mainly contains carbon nanotubes may be further laminated on the cellulose fiber layer.

In the laminate, in a case where the insulating layer is laminated on the carbon nanotube layer, the insulating layer may be formed in a lamination pattern in which the insulating layer is not laminated on a part of the carbon nanotube layer.

In the laminate, the microfibrous cellulose may be a cellulose nanofiber having a fiber width of 100 nm or smaller.

In the laminate, a film thickness of two layers of the cellulose fiber layer and the carbon nanotube layer may be 1 to 10 μm.

The laminate may be used to absorb and reflect a near field electromagnetic wave.

The laminate may be used to absorb a far field electromagnetic wave.

A coating member according to the present invention is a coating member that has the laminate.

A laminate manufacturing method according to the present invention includes: applying an insulating layer that mainly contains a resin composition; applying a cellulose fiber layer that mainly contains a microfibrous cellulose having a fiber width of 1000 nm or smaller onto the insulating layer; and applying a carbon nanotube layer that mainly contains carbon nanotubes onto the cellulose fiber layer.

Advantageous Effects of Invention

According to the present invention, it is possible to provide the laminate in which the carbon nanotube layer is stably laminated; the coating member having the same; and the laminate manufacturing method.

BRIEF DESCRIPTION OF DRAWINGS

FIG. 1 is a schematic diagram illustrating a cross-section of a laminate according to a first embodiment.

FIG. 2 is a graph illustrating an electromagnetic wave absorption property and an electromagnetic wave reflection property of a laminate in the related art in a near field of 5 GHz or less.

FIG. 3 is a graph illustrating an electromagnetic wave absorption property and an electromagnetic wave reflection property of the laminate according to the first embodiment in a near field of 5 GHz or less.

FIG. 4 is a graph illustrating the electromagnetic wave absorption property of the laminate in the related art and the electromagnetic wave absorption property of the laminate according to the first embodiment in a near field of 5 to 20 GHz.

FIG. 5 is a schematic diagram illustrating a cross-section of a laminate according to a second embodiment.

FIG. 6 is a graph illustrating an electromagnetic wave absorption property and an electromagnetic wave reflection property of the laminate according to the second embodiment in a near field of 5 GHz or less.

FIG. 7 is a graph illustrating the electromagnetic wave absorption property of the laminate in the related art and the electromagnetic wave absorption property of the laminate according to the second embodiment in a near field of 5 to 20 GHz.

FIG. 8A is a graph illustrating the relative permittivity of the laminate according to the second embodiment in a far field of 18 to 30 GHz, and FIG. 8B is a graph illustrating the relative permittivity of the laminate according to the second embodiment in a far field of 40 to 65 GHz or more.

FIG. 9 is a schematic diagram illustrating a cross-section of a coating member according to a third embodiment.

FIG. 10 is a schematic diagram illustrating a cross-section of a laminate according to another embodiment.

FIG. 11 is a schematic diagram illustrating a cross-section of a laminate according to another embodiment.

FIGS. 12A and 12B is a schematic diagram illustrating a cross-section of a laminate according to another embodiment.

DESCRIPTION OF EMBODIMENTS

A laminate and a coating member according to the present invention will be described with reference to the drawings. The laminate according to the present invention is a film-like member that reflects and/or absorbs electromagnetic waves, includes an insulating layer and a conductive layer, and has a structure in which the conductive layer is laminated on the upper side of the insulating layer. In the following, as an embodiment of the laminate and the coating member according to the present invention, examples of the laminate and the coating member that can effectively suppress noise by reflecting and/or absorbing a near field electromagnetic wave and also absorbing an electromagnetic plane wave will be described. In addition, in the following, the insulating layer side (lower side in the figure) with respect to the conductive layer is referred to as "lower" or a "lower side", and the conductive layer side (upper side in the figure) with respect to the insulating layer is referred to as "upper" or an "upper side". In addition, in the present invention, the term "laminated on" includes a case of being directly laminated on a certain layer, and also includes a case of being laminated over the upper side of a certain layer but not directly laminated on the certain layer.

First Embodiment

FIG. 1 is a schematic diagram illustrating a cross-section of a laminate 1 according to a first embodiment. As illustrated in FIG. 1, the laminate 1 according to the first embodiment includes a resin insulating layer 10, an insulating coating layer 20, a cellulose fiber layer 30, and a carbon nanotube layer 40 in this order. Specifically, in the laminate 1, the insulating coating layer 20 is laminated on the resin insulating layer 10, the cellulose fiber layer 30 is laminated on the insulating coating layer 20, and the carbon nanotube layer 40 is laminated on the cellulose fiber layer 30. In the laminate 1 according to the first embodiment, the resin insulating layer 10, the insulating coating layer 20, and the cellulose fiber layer 30 constitute an insulating layer, and the carbon nanotube layer 40 constitutes a conductive layer.

<Resin Insulating Layer 10>

The resin insulating layer 10 may be formed of an insulating material, and examples of the insulating material include a polyimide (PI); polyester-based resins such as polyethylene terephthalate (PET) and polybutylene terephthalate; polyolefin-based resins such as polyethylene (PE) and polypropylene (PP); various acrylic-based resins such as polyethylene naphthalate (PEN), nylon, polytetrafluoroethylene (PTFE), polyether ether ketone (PEEK), polyether sulfone (PES), polyvinyl alcohol (PVA), polycarbonate (PC), polyarylate (PAR); urethane-based resins; fluorine-based resins; styrene-based resins; epoxy-based resins; and vinyl-based resins. In addition, a resin sheet can be used as the resin insulating layer 10, and in this case, a PI sheet or a polyester sheet is preferable, and a PI sheet or a PET sheet is particularly preferably used. The resin insulating layer 10 is a layer mainly containing the above described resin composition, and specifically, the resin insulating layer 10 contains 50% or more of the resin composition, and more preferably 80% or more of the resin composition.

The resin insulating layer 10 may have a single-layer structure, or may have a multi-layer structure of two or three or more layers. A shape (outer shape) of the resin insulating layer 10 is preferably a sheet shape (thin flat shape) such as a long shape, a film shape, a tape shape, or a plate shape. A thickness of the resin insulating layer 10 can be appropriately set according to the application of the laminate 1, and in the present embodiment, in order to reduce a film thickness of the laminate 1, the thickness of the resin insulating layer 10 is preferably set to 1 to 100 μm, and also can be set to 1 to 20 μm.

<Insulating Coating Layer 20>

As illustrated in FIG. 1, the insulating coating layer 20 is laminated on the resin insulating layer 10. The insulating coating layer 20 is a layer for enhancing the adhesion between the resin insulating layer 10 and the cellulose fiber layer 30 described later, and can be, for example, a layer mainly containing an aqueous ester or urethane resin. In addition, the insulating coating layer 20 according to the present embodiment has actions of supporting the carbon nanotube layer 40 applied on the insulating coating layer 20 and ensuring a certain film thickness allowing to contain a certain amount of carbon nanotubes in the carbon nanotube layer 40. The insulating coating layer 20 is not an essential constituent for the laminate 1 and may be omitted, but it is preferable to form the insulating coating layer 20 in a case where it is necessary to ensure a certain film thickness in the carbon nanotube layer 40.

<Cellulose Fiber Layer 30>

As illustrated in FIG. 1, the cellulose fiber layer 30 is laminated on the insulating coating layer 20 and mainly contains fibrous cellulose having a fiber width (an average diameter of fibers) of 1000 nm or smaller. As such fibrous cellulose, cellulose nanofibers having a fiber width of 100 nm or smaller are preferable. The thickness of the cellulose fiber layer 30 can be appropriately set according to the application of the laminate 1, and in the present embodiment, in order to reduce the film thickness of the laminate 1, a thickness of two layers including the insulating coating layer 20 and the cellulose fiber layer 30 is set to 1 to 5 μm. The cellulose fiber layer 30 is a layer mainly containing fibrous cellulose having a fiber width of 1000 nm or smaller, and specifically, a layer containing 50% or more of the fibrous cellulose, and more preferably containing 80% or more of the fibrous cellulose.

Examples of pulp fibers used as a raw material for the fibrous cellulose include chemical pulp such as bamboo pulp, broadleaf kraft pulp (LKP) such as broadleaf bleached kraft pulp (LBKP) and broadleaf unbleached kraft pulp (LUKP), and needle kraft pulp (NKP) such as needle bleached kraft pulp (NBKP) and needle unbleached kraft pulp (NUKP); mechanical pulp such as stone-ground pulp (SGP), pressure stone-ground pulp (PGW), refiner ground pulp (RGP), chemi-ground pulp (CGP), thermo-ground pulp (TGP), ground pulp (GP), thermo-mechanical pulp (TMP), chemi-thermo-mechanical pulp (CTMP), and bleached thermo-mechanical pulp (BTMP); waste paper pulp produced from brown waste paper, kraft envelope waste paper, magazine waste paper, newspaper waste paper, flyer waste paper, office waste paper, cardboard waste paper, wood-free waste paper, Kent waste paper, imitation Japanese vellum waste paper, land certificate waste paper, groundwood waste paper, and the like; deinking pulp (DIP) produced by deinking waste paper pulp; and the like. As long as the effects of the present invention are not impaired, one type of pulp may be used alone, or a plurality of types of pulp may be used in combination. These pulp fibers are defibrated by mechanical treatment such as a beater treatment method, a DDR method, a grinder method, an aqueous counter collision method, homogenizer, ball mill, roll mill, cutter mill, or chemical treatment (for example, TEMPO oxidation treatment) such as oxygen treatment and acid treatment, so that fibrous cellulose can be obtained.

In addition, the cellulose fiber layer 30 may optionally contain other paper-making chemicals as long as the effects of the present invention are not impaired. Examples of other paper-making chemicals include pigments, dyes, fillers, sizing agents, abrasion resistance improvers, water resistant agents, surfactants, waxes, rust preventive agents, conductive agents, and paper dust falling preventive agents. As long as the effects of the present invention are not impaired, one type of paper-making chemicals may be used alone, or a plurality of types of paper-making chemicals may be used in combination.

<Carbon Nanotube Layer 40>

As illustrated in FIG. 1, the carbon nanotube layer 40 is laminated on the cellulose fiber layer 30. The carbon nanotube layer 40 is a layer mainly containing carbon nanotubes. A thickness of the carbon nanotube layer 40 can also be appropriately set according to the application of the laminate 1, and in a case of reducing the film thickness of the laminate 1, the thickness of the carbon nanotube layer 40 is preferably set to 0.1 to 7 μm. The carbon nanotube layer 40 is a layer mainly containing carbon nanotubes, and specifically, a layer containing 50% or more of carbon nanotubes, and more preferably 80% or more of carbon nanotubes.

As described above, in the laminate 1 according to the present embodiment, in a case of reducing the thickness of the laminate 1, a thickness of a layer in which the insulating coating layer 20, the cellulose fiber layer 30, and the carbon nanotube layer 40 are combined (in a case of omitting the insulating coating layer 20, a layer in which the cellulose fiber layer 30 and the carbon nanotube layer 40 are combined) is 1 to 10 μm. As described above, the thickness of the layer in which the insulating coating layer 20, the cellulose fiber layer 30, and the carbon nanotube layer 40 are combined (in the case of omitting the insulating coating layer 20, the layer in which the cellulose fiber layer 30 and the carbon nanotube layer 40 are combined) is reduced, so that the film thickness of the entire laminate 1 can be set to 30 μm or smaller, and the laminate having a thinner thickness than the laminate in the related art can be provided.

The carbon nanotubes are not particularly limited, and can be used as those produced by various methods such as an arc discharge method, a laser evaporation method, and a chemical vapor deposition method (CVD method). A structure of each carbon nanotube is also not particularly limited, but in order to ensure high conductivity, it is preferable to use a structure having a triple bond between carbons such as an acetylene skeleton. In addition, the carbon nanotubes may be single-walled carbon nanotubes (for example, one to three layers, and typically one layer or two layers), and may be multi-walled carbon nanotubes (for example, four to two hundred layers, and typically four to sixty layers), but it is preferable that the carbon nanotube layer 40 is mainly constituted of multi-walled carbon nanotubes. In addition, the carbon nanotube layer 40 may be constituted of the single-walled carbon nanotubes and the multi-walled carbon nanotubes that are contained at an optional ratio (a mass ratio of the single-walled carbon nanotubes:the multi-walled carbon nanotubes is, for example, 100:0 to 50:50, and preferably 100:0 to 80:20). Alternatively, the carbon nanotubes may be vapor-grown carbon fibers (VGCF).

A length and a diameter of each carbon nanotube are also not particularly limited, but the carbon nanotube layer 40 according to the present embodiment can be configured as follows. For example, the length of each carbon nanotube can be 100 μm or smaller, and preferably 20 to 30 μm. In addition, the diameter of each carbon nanotube can be 50 nm or smaller, and preferably 20 nm or smaller.

A weight of the carbon nanotube layer 40 per unit area (one square centimeter) of the laminate 1 (that is, weight per unit area in terms of the solid content) is also not particularly limited, but can be 0.1 μg or more, and preferably can be 0.5 μg or more. As a result, good conductivity can be imparted to a surface of the laminate 1. The upper limit of the weight of the carbon nanotube layer 40 is not particularly limited, but in a case where the weight of the carbon nanotube layer 40 is too large, the carbon nanotube layer 40 may be easily peeled off from the cellulose fiber layer 30. From the viewpoint that the carbon nanotube layer 40 is suppressed to be peeled off from the cellulose fiber layer 30, it is appropriate that the weight of the carbon nanotube layer 40 per unit area (one square centimeter) of the resin insulating layer 10 is 30 μg or less, preferably 15 μg or less, and more preferably 3.5 μg or less.

<Laminate Manufacturing Method>

The outline of a manufacturing method for the laminate 1 according to the present embodiment will be described. The laminate 1 of the present embodiment can be manufactured by, for example, the following steps (1) and (2).

(1) The sheet-shaped resin insulating layer 10 is prepared, the insulating coating layer 20 is applied onto the resin insulating layer 10, dried, and then the cellulose fiber layer 30 is applied. The insulating coating layer 20 and the cellulose fiber layer 30 can be applied by means such as gravure printing, flexographic printing, silk screen printing, or offset printing.

(2) After the cellulose fiber layer 30 is dried, a slurry for forming a carbon tube layer, which contains carbon nanotubes, is applied onto the cellulose fiber layer 30, and further dried to form the carbon nanotube layer 40 on the cellulose fiber layer 30. The carbon nanotube layer 40 can also be applied by means such as gravure printing, flexographic printing, silk screen printing, or offset printing.

In the above printing methods, a thickness of the carbon nanotube layer 40 can be adjusted by continuously applying the slurry for forming a carbon nanotube layer. Similarly, thicknesses of the insulating coating layer 20 and the cellulose fiber layer 30 can be adjusted by continuously applying the insulating coating layer 20 and the cellulose fiber layer 30 respectively.

The carbon nanotube layer 40 is formed in such a manner that the slurry for forming a carbon nanotube layer, which contains carbon nanotubes and a liquid medium, is applied onto the cellulose fiber layer 30, and a liquid solvent is volatilized by heating. The slurry for forming a carbon nanotube layer according to the present embodiment is a water-dispersed slurry in which carbon nanotubes are dispersed in water as a liquid solvent. Therefore, the carbon nanotube layer 40 formed by drying of the slurry for forming a carbon nanotube layer can be in a state of containing almost no organic solvent residue or resin binder after the water has volatilized.

The slurry for forming a carbon nanotube layer is preferably one in which a percentage of a liquid solvent (water) is 95% by mass or more (in other words, a percentage of a component other than the solvent, that is, a non-volatile content component is less than 5% by mass), and is more preferably a liquid medium in which the above percentage is 97% or more. In addition, as the liquid solvent, a mixed solution of alcohol and water can be used instead of water. In addition, the slurry for forming a carbon nanotube layer can contain various additives other than the above within a range being not deviated from the object of the present invention. Suitable examples of the additives include surfactants, antifoaming agents, antioxidants, dispersants, viscosity modifiers, and the like.

The heating temperature at which the slurry for forming the carbon nanotube layer is dried can be appropriately set in consideration of the composition of the liquid medium (particularly the boiling point of the solvent) and the like. Usually, the drying temperature is preferably about 40° C. to 250° C. (for example, about 60° C. to 150° C.). After drying, as necessary, heat treatment, washing treatment, or the like may be carried out to remove the additives contained in the carbon nanotube layer 40.

Example 1

Here, based on FIGS. 2 and 3, measurement results of electromagnetic wave absorption properties and electromagnetic wave reflection properties of laminates in the related art and the laminate 1 according to the first embodiment in a near field of 5 GHz or less, will be described. FIG. 2 is a graph illustrating the electromagnetic wave absorption properties (upper side of FIG. 2) and the electromagnetic wave reflection properties (lower side of FIG. 2) of the laminates in the related art in a near field of 5 GHz or less, and electromagnetic wave absorptances (dB) and electromagnetic wave reflectances (dB) are illustrated along the vertical axis, and frequencies (GHz) are illustrated along the horizontal axis. In addition, in FIG. 2, (A) is a measurement result of the laminate measured without blocking electromagnetic waves, (B) is a measurement result of the laminate in the related art (commercially available product 1), (C) is a measurement result of the laminate in the related art (commercially available product 2), and (D) is a measurement result of the laminate in the related art (commercially available product 3). In the examples illustrated in FIGS. 2 and 3, the electromagnetic wave absorption property and the electromagnetic wave reflection property were measured by using a measuring device having a measurement frequency of up to 5 GHz according to a microstrip line method (based on IEC62333-2).

As illustrated in FIG. 2, in (B) to (D) that corresponds to the laminates in the related art, the electromagnetic wave absorptances greatly varied depending on the frequencies in a near field of 5 GHz or less. In addition, in (B) to (D) that corresponds to the laminates in the related art, since the electromagnetic wave reflectances also varied depending on the frequencies, and reflection increased at a specific wavelength, there was a concern that a module that is a subject to be shielded may be adversely affected.

Meanwhile, the measurement results of the electromagnetic wave absorption properties and the electromagnetic wave reflection properties of the laminates 1 according to the first embodiment in a near field of 5 GHz or less are illustrated in FIG. 3. In FIG. 3, (E) illustrates a measurement result obtained by the laminate 1 according to the present embodiment, which has a film thickness of the resin insulating layer 10 of 12.0 μm, and (F) illustrates a measurement result obtained by the laminate 1 that has a film thickness of the resin insulating layer 10 of 4.5 μm. In addition, in FIG. 3, for the reference, the above (B) to (D) illustrating the measurement results of the laminates in the related art are represented by lines thinner than those of (E) and (F).

As illustrated in FIG. 3, it was confirmed that in (E) and (F) that corresponds to the laminates 1 according to the first embodiment, the higher electromagnetic wave absorptances in the frequency band up to 5 GHz than those of (B) to (D) that corresponds to the laminates in the related art can be obtained while reducing the film thickness in a near field of 5 GHz or less. In addition, in (E) and (F) that corresponds to the laminates 1 according to the first embodiment, although the electromagnetic wave absorptances are gently curved according to the frequencies, the fluctuations are gradual as compared with those of (B) to (D) that corresponds to the laminates in the related art. As described above, it was confirmed that in (E) and (F) that corresponds to the laminates 1 according to the first embodiment, the electromagnetic wave absorptances are higher than those of (B) to (D) that corresponds to the laminates in the related art in a near field of 5 GHz or less, and the fluctuations of the electromagnetic wave absorptances for the frequencies are gradual and stable. In addition, as illustrated in the lower side of FIG. 3, in (E) and (F) that corresponds to the laminates 1 according to the first embodiment, the fluctuations of the electromagnetic wave reflectance were stable and gradual as compared with (B) to (D) that corresponds to laminates in the related art in a near field of 5 GHz or less.

Next, based on FIG. 4, measurement results of electromagnetic wave absorption properties of the laminate in the related art and the laminate 1 according to the first embodiment in a near field of 5 to 20 GHz, will be described. FIG. 4 is a graph illustrating the electromagnetic wave absorption properties of the laminate in the related art and the laminate 1 according to the first embodiment in a near field of 5 to 20 GHz. In FIG. 4, the laminate of (B) described above was used as the laminate in the related art, and the laminate of (F) described above was used as the laminate 1 according to the first embodiment. In addition, in the example illustrated in FIG. 4, the electromagnetic wave absorption property and the electromagnetic wave reflection property were measured by using a measuring device having a measurement frequency of 5 to 20 GHz according to a microstrip line method (based on IEC62333-2).

As illustrated in FIG. 4, it was confirmed that as similar to a near field of 5 GHz or less illustrated in FIG. 3, (F) that is the laminate 1 according to the first embodiment can also obtain the higher electromagnetic wave absorptance than those of (B) to (D) that are the laminates in the related art in a near field of 5 to 20 GHz or less. In addition, although not illustrated in the figures, it was found that the laminate 1 according to the first embodiment obtains the higher electromagnetic wave absorptance than the laminate in the related art, even in electromagnetic wave range of 30 GHz or more. Furthermore, as illustrated in FIG. 4, in the laminate in the related art, there was a problem that the electromagnetic wave absorption property varies depending on frequencies of the electromagnetic waves, but it was also confirmed that in the laminate 1 according to the present embodiment, the electromagnetic wave absorption property can be suppressed from varying depending on frequencies of the electromagnetic waves, and frequency dependence of electromagnetic wave absorption decreases.

As described above, the laminate 1 according to the first embodiment includes the resin insulating layer 10, the insulating coating layer 20, the cellulose fiber layer 30, and the carbon nanotube layer 40, the insulating coating layer 20 is laminated on the resin insulating layer 10, the cellulose fiber layer 30 is laminated on the insulating coating layer 20, and the carbon nanotube layer 40 is laminated on the cellulose fiber layer 30, so that it is possible to provide the laminate having the excellent stability while reducing the film thickness of the laminate 1. That is, in the related art, there are problems that the thickness is increased to about 100 µm since a structure in which a metal thin film formed of copper or aluminum, or a metal thin film containing ferritic metal powder is laminated on the insulating layer is adopted in order to shield the electromagnetic waves, the absorption of the electromagnetic waves decreases since surface resistivity is low and electromagnetic wave reflection is too strong, the laminate is heavy, the application is limited, and the like. In addition, even in a case of adopting a structure having the carbon nanotube layer in order to solve such problems, there were problems that the adhesion between the carbon nanotube layer and the insulating layer formed of resin or the like is low, and a stable laminate cannot be obtained. In response to these problems, in the laminate 1 according to the first embodiment, the carbon nanotube layer 40 is not directly laminated on the resin insulating layer 10, the cellulose fiber layer 30 is laminated on the resin insulating layer 10 (and the insulating coating layer 20), and the carbon nanotube layer 40 is laminated thereon. Each of the adhesion between the resin insulating layer 10 (and the insulating coating layer 20) and the cellulose fiber layer 30 and the adhesion between the cellulose fiber layer 30 and the carbon nanotube layer 40 is high, so that with such a structure, it is possible to provide the laminate 1 in which the carbon nanotube layer 40 is stably laminated. As described above, in the first embodiment, it is possible to provide the laminate 1 in which the film thickness of the entire laminate 1 is as thin as 30 µm or smaller by the carbon nanotube layer 40 being included, and the carbon nanotube layer 40 is stably laminated even though the carbon nanotube layer 40 is provided.

Furthermore, as illustrated in FIGS. 2 and 3, in the laminate 1 according to the first embodiment, the electromagnetic wave absorption property and the electromagnetic wave reflection property in the near field of electromagnetic wave can also be improved as compared with the laminate in the related art, while reducing the film thickness. Specifically, since the surface resistivity of the carbon nanotube layer 40 of the laminate 1 is 50 to 1000 ff□, it is possible to stably ensure the absorption property of the electromagnetic waves as compared with the laminate in the related art. As a result, a capacity of absorbing the near field electromagnetic wave can be enhanced, and the noise suppression effect can be improved. In addition, in the present embodiment, since the insulating coating layer 20 exists under the carbon nanotube layer 40, the noise suppression effect can be further exhibited. That is, in the laminate 1 according to the first embodiment, although the noise suppression effect can be exhibited by the carbon nanotube layer 40 absorbing the near field electromagnetic wave, in a case where the film thickness of the carbon nanotube layer 40 is thin, the carbon nanotube layer 40 cannot absorb some of the electromagnetic waves, and some of the electromagnetic waves may pass through the carbon nanotube layer 40. However, the insulating coating layer 20 is formed under the carbon nanotube layer 40, so that an interface surface having a large difference in the surface resistivity is formed between the carbon nanotube layer 40 and the insulating coating layer 20, the electromagnetic waves that have passed through the carbon nanotube layer 40 are reflected on the interface surface, and the carbon nanotube layer 40 can reflect and absorb the reflected electromagnetic waves. As a result, the laminate 1 according to the present embodiment can exhibit the higher noise suppression effect. In addition, the laminate 1 according to the present embodiment is also advantageous in that the frequency dependence of the electromagnetic wave absorption, in which the electromagnetic wave absorption property varies depending on a frequency, is low as compared with the laminate in the related art.

In addition, the laminate 1 according to the first embodiment has electromagnetic wave absorption property up to 30 GHz, which is the entrance of millimeter waves, as a noise suppression range (electromagnetic wave absorption range). This range can cover all frequency bands of 3.5 GHz band, 4.6 to 5 GHz bands, and 28 GHz band used in 5G (5th generation mobile communication system), and the laminate 1 according to the present embodiment is expected to be applied to a noise suppression sheet or the like for 5G compatible communication devices as a noise suppression member for the 5G compatible communication devices.

Second Embodiment

Next, a laminate 1a according to a second embodiment will be described. FIG. 5 is a schematic diagram illustrating a cross-section of the laminate 1a according to the second embodiment. As illustrated in FIG. 5, the laminate 1a according to the second embodiment has the same structure as the laminate 1 according to the first embodiment, except that the insulating coating layer 20, the cellulose fiber layer 30, and a carbon nanotube layer 40 are further laminated on the carbon nanotube layer 40.

As illustrated in FIG. 5, in the laminate 1a according to the second embodiment, the second layer of the insulating coating layer 20 is further laminated on the first layer of the carbon nanotube layer 40, the second layer of the cellulose fiber layer 30 is further laminated on the second layer of the insulating coating layer 20, and the second layer of the carbon nanotube layer 40 is further laminated on the second layer of the cellulose fiber layer 30. As described above, in the laminate 1a according to the second embodiment, the thickness of the carbon nanotube layer 40 in the entire laminate 1a is increased by a plurality of the carbon nanotube layers 40 being laminated, thereby the noise capable of being further reduced.

In a case where the plurality of the carbon nanotube layers 40 are laminated, the moldability of the carbon nanotube layers 40 may decrease. Therefore, in the laminate 1a according to the second embodiment, the insulating coating layer 20 and the cellulose fiber layer 30 are laminated on the carbon nanotube layer 40, and the carbon nanotube layer 40 is laminated thereon. In addition, in a case where the insulating coating layer 20 is laminated on the carbon nanotube layer 40, the insulating coating layer 20 is laminated after the carbon nanotube layer 40 is dried. Since an alcohol solvent is used in a slurry for an insulating coating layer, stable lamination can be achieved even in the case where the insulating coating layer 20 is directly laminated on the carbon nanotube layer 40, unlike the case where the carbon nanotube layer 40 is laminated on the insulating coating layer 20.

In addition, in the example illustrated in FIG. 5, a configuration in which two carbon nanotube layers 40 are laminated is illustrated, but the present invention is not limited to this configuration, and a configuration in which three or four or more carbon nanotube layers 40 are laminated can be adopted.

Example 2

Next, an electromagnetic wave absorption property and an electromagnetic wave reflection property of the laminate 1a according to the second embodiment in a near field of 5 GHz or less, will be described. FIG. 6 is a graph illustrating the electromagnetic wave absorption property and the electromagnetic wave reflection property of the laminate 1a according to the second embodiment in a near field of 5 GHz or less. In FIG. 6, (G) illustrates a measurement result obtained by the laminate 1a in which two resin insulating layers 10 each of which has a thickness of 12 μm are laminated, (H) illustrates a measurement result obtained by the laminate 1a in which two resin insulating layers 10 each of which has a thickness of 4.5 μm are laminated, and (I) illustrates a measurement result obtained by the laminate 1a in which three resin insulating layers 10 each of which has a thickness of 4.5 μm are laminated. In addition, also in FIG. 6, similar to FIG. 3, the above (B) to (D) illustrating a near shield film in the related art are represented by lines thinner than those of (G) to (I). In addition, in the example illustrated in FIG. 6, the electromagnetic wave absorption property and the electromagnetic wave reflection property were measured by using a measuring device having a measurement frequency of up to 5 GHz according to a microstrip line method (based on IEC62333-2).

As illustrated in FIG. 6, in (G) to (I) that corresponds to the laminates 1a according to the second embodiment, the electromagnetic wave absorptances could be increased in most frequency bands as compared with (B) to (D) that corresponds to the laminates in the related art while reducing the film thickness in a near field of 5 GHz or less. In addition, since in (G) to (I) that corresponds to the laminates 1a according to the second embodiment, each laminate 1a has two carbon nanotube layers 40, the electromagnetic wave absorptances could be increased as compared with (E) and (F) that corresponds to the laminates 1 according to the first embodiment.

Furthermore, in (G) to (I) that corresponds to the laminates 1a according to the second embodiment, electromagnetic wave absorptances are gently curved according to the frequencies as similar to (G) to (I) that corresponds to the laminates 1 according to the first embodiment, but the fluctuations of the electromagnetic wave absorptances are gradual and totally stable as compared with (B) to (D) that are the laminates in the related art.

In addition, in (G) to (I) that corresponds to the laminates 1a according to the second embodiment, as illustrated in FIG. 6, the electromagnetic wave absorptances at a specific frequency band could be particularly increased in a near field of 5 GHz or less. For example, in (G) that is the laminate 1a in which two resin insulating layers 10 each of which has a thickness of 12 μm are laminated, the electromagnetic wave absorptance at the frequency band around 5.0 to 5.5 GHz could be particularly increased, and in (I) that corresponds to the laminate 1a in which three resin insulating layers 10 each of which has a thickness of 4.5 μm are laminated, the electromagnetic wave absorptance at the frequency band around 5.3 to 5.8 GHz could be particularly increased. In this way, it was found that the electromagnetic wave absorption property of the laminate 1a can be adjusted by changing the lamination aspect such as the layer thickness or the number of laminations of each layer of the resin insulating layer 10, the insulating coating layer 20, the cellulose fiber layer 30, and the carbon nanotube layer 40 in a near field of 5 GHz or less.

Furthermore, in (G) to (I) that corresponds to the laminates 1a according to the second embodiment, as similar to (E) and (F) that corresponds to the laminates 1 according to the first embodiment, the fluctuations of the electromagnetic wave reflectances were totally gradual and stable as compared with (B) to (D) that are the laminates in the related art in a near field of 5 GHz or less.

Next, based on FIG. 7, measurement results of electromagnetic wave absorption properties of the laminate in the related art and the laminate 1a according to the second embodiment in a near field of 5 to 20 GHz, will be described. FIG. 7 is a graph illustrating the electromagnetic wave absorption properties of the laminate in the related art and the laminate 1a according to the second embodiment in a near field of 5 to 20 GHz. In FIG. 7, the laminate of (B) described above was used as the laminate in the related art, and the laminate of (H) described above was used as the laminate 1a according to the second embodiment. In addition, in the example illustrated in FIG. 7, the electromagnetic wave absorption property and the electromagnetic wave reflection property were measured by using a measuring device having a measurement frequency of 5 to 20 GHz according to a microstrip line method (based on IEC62333-2).

As illustrated in FIG. 7, it was confirmed that as similar to a near field of 5 GHz or less illustrated in FIG. 6, (H) that corresponds to the laminate 1a according to the second embodiment can also obtain the higher electromagnetic wave absorptance than those of (B) to (D) that corresponds to the laminates in the related art in a near field of 5 to 20 GHz or less. In addition, although not illustrated in the figures, it was found that the laminate 1a according to the second embodiment obtains the higher electromagnetic wave absorptance than the laminate in the related art, even in electromagnetic wave range of 30 GHz or more. Furthermore, as illustrated in FIG. 7, there was a problem that the laminate in the related art has the electromagnetic wave absorption property that varies depending on frequencies of the electromagnetic waves, but it was also confirmed that the laminate 1a according to the second embodiment has the electromagnetic wave absorption property that can be suppressed from varying depending on frequencies of the electromagnetic waves, and frequency dependence of electromagnetic wave absorption decreases.

Next, based on FIGS. 8A and 8B, measurement results of permittivity properties of the laminate in the related art and the laminate 1a according to the second embodiment in a far field of 18 to 65 GHz, will be described. FIG. 8A is a graph illustrating the relative permittivity of the laminate 1a according to the second embodiment in a far field of 18 to 30 GHz, and FIG. 8B is a graph illustrating the relative permittivity of the laminate 1a according to the second embodiment in a far field of 40 to 65 GHz or more. In the example illustrated in FIG. 8A, S11 (attenuation of the reflected wave with respect to the laminate) and S21 (attenuation of the transmitted wave with respect to the laminate) were measured by a waveguide method using a network analyzer to calculate the relative permittivity of the laminate 1a. In addition, in the example illustrated in FIG. 8B, the relative permittivity was measured by a free-space method also using a network analyzer.

As illustrated in FIGS. 8A and 8B, it was found that the laminate 1a according to the second embodiment has a large difference between a real part and an imaginary part of the relative permittivity in a far field of 18 to 65 GHz, and has properties in which electricity easily flows and is easily converted into thermal energy, that is, a far field electromagnetic wave is easily absorbed. In a case where the laminate 1a has a property in which electricity easily flows, the surface resistivity tends to decrease and the reflection of electromagnetic waves tends to be strong. However, it is considered that the film thickness of the resin insulating layer 10, the insulating coating layer 20, or the carbon nanotube layer 40, or the like is adjusted, so that the surface resistivity of the laminate 1a can be adjusted, and as a result, the absorption property and the reflection property of the far field electromagnetic wave can be appropriately adjusted.

As described above, with the laminate 1a according to the second embodiment, it is possible to provide the laminate that has a function of absorbing and reflecting a near field electromagnetic wave and a function of absorbing a far field electromagnetic wave, and can be used in the application of suppressing the noise by absorbing the far field electromagnetic wave (for example, the application in which an electromagnetic wave laser beam transmitted from an in-vehicle device is absorbed at a position away from the in-vehicle device to prevent the laser beam from being scattered, and the like) in addition to the application of suppressing the noise in a near field (for example, the application in which the noise generated from batteries of smartphones is suppressed, and the like). Since the function of absorbing the far field electromagnetic wave is caused by the carbon nanotube layer 40, it is considered that the laminate 1 according to the first embodiment also has the function of absorbing the far field electromagnetic wave. However, in the laminate 1a according to the second embodiment, the insulating coating layer 20, the cellulose fiber layer 30, and the carbon nanotube layer 40 are further laminated on the carbon nanotube layer 40, so that the thickness of the carbon nanotube layers 40 in the entire laminate 1a can be increased. Therefore, the higher absorption property of the electromagnetic wave and the higher noise suppression effect on the far field electromagnetic wave and the near field electromagnetic wave than those of the laminate 1 according to the first embodiment can be exhibited. That is, although the carbon nanotube layer 40 can absorb near field electromagnetic wave and far field electromagnetic wave, the thickness of the carbon nanotube layer 40 is thin and some electromagnetic waves may pass through the carbon nanotube layer 40. However, in the laminate 1a according to the second embodiment, the second layer of the insulating coating layer 20 is interposed between the first layer of the carbon nanotube layer 40 and the second layer of the carbon nanotube layer 40, and the first layer of the insulating coating layer 20 further exists under the first layer of the carbon nanotube layer 40. As a result, in the laminate 1a according to the second embodiment, due to the large difference in surface resistivity between the carbon nanotube layer 40 and the insulating coating layer 20, an interface surface that reflects electromagnetic waves is formed in multiple layers, so that the electromagnetic waves that have passed through the carbon nanotube layer 40 are multiply reflected at a plurality of the interface surfaces, and the reflected electromagnetic waves are absorbed by each carbon nanotube layer 40. Therefore, the laminate 1a has the higher absorption property of the electromagnetic waves and the higher noise suppression effect than those of the laminate 1 according to the first embodiment.

In addition, by adopting the structure in which the insulating coating layer 20 and the cellulose fiber layer 30 are laminated on the first layer of the carbon nanotube layer 40, and the second layer of the carbon nanotube layer 40 is laminated thereon, it is possible to suppress a decrease in moldability of the laminate 1a. Since the laminate 1a according to the second embodiment further includes the insulating coating layer 20, the cellulose fiber layer 30, and the carbon nanotube layer 40 as compared with the laminate 1 according to the first embodiment, the film thickness of the entire laminate 1a is increased. However, since the thickness of three layers of the insulating coating layer 20, the cellulose fiber layer 30, and the carbon nanotube layer 40 is about 1 to 12 μm, it is possible to provide the laminate 1a whose thickness is sufficiently thinner than that of the laminate in the related art. Furthermore, in the laminate 1a according to the second embodiment, the electromagnetic wave absorption property at a specific frequency can be adjusted as in the laminate 1a of (G) illustrated in FIG. 6 by variously changing the lamination aspect of each layer.

In the laminate 1a according to the second embodiment, in the case where the plurality of the carbon nanotube layers 40 are laminated, the shielding performance at a specific frequency band can be adjusted by changing the film thickness of each carbon nanotube layer 40, or changing the film thickness of the insulating coating layer 20 laminated between the carbon nanotube layers 40. In addition, in the case where the insulating coating layer 20 is laminated on the carbon nanotube layer 40, by not intentionally forming the insulating coating layer 20 on a specific portion of the carbon nanotube layer 40, the laminate may have a configuration in which the insulating coating layer 20 forms a specific pattern such that a portion where the carbon nanotube layers 40 are continuously laminated in a lamination direction (for example, the first layer of the carbon nanotube layer 40 and the second layer of the carbon nanotube layer 40 are continuously laminated) and a portion where the insulating coating layer 20 covers the carbon nanotube layer 40. In this case, a highly conductive portion where the carbon nanotube layers 40 are continuously laminated and a portion where the insulating coating layer 20 covers the carbon nanotube layer 40 to absorb the electromagnetic waves with high efficiency can be formed at once, which enables to ensure the higher electromagnetic wave absorption property with the synergistic effect. Since the cellulose fiber layer 30 is extremely small and extremely thin, after the laminate 1a is manufactured, the carbon nanotube layer 40 can be continuously laminated on a portion where the insulating coating layer 20 is not laminated on the carbon nanotube layer 40, even though the cellulose fiber layer 30 is normally formed. Furthermore, the laminate 1a according to the present embodiment can be used as a heat diffusion sheet by using the high thermal conductivity that the carbon nanotube layer 40 (carbon nanotube) has. In this case, the heat diffusion effect can be adjusted by appropriately forming a layer in which the carbon nanotube layer 40 is completely covered with the insulating coating layer 20 and a layer in which the pattern obtained by the insulating coating layer 20 described above is formed.

Third Embodiment

Next, a coating member 2 according to a third embodiment will be described. FIG. 9 is a schematic diagram illustrating a cross-section of the coating member 2 according to the third embodiment. As illustrated in FIG. 9, the coating member 2 according to the third embodiment has the same structure as the laminate 1 according to the first embodiment, except that an adhesive layer 50 and a release film 60 are provided under the resin insulating layer 10.

The adhesive layer 50 is an adhesive layer for adhering to another member, and known resins such as an acrylic-based resin, a silicone-based resin, a polyester-based resin, a polyvinyl acetate-based resin, a polyvinyl ether-based resin, and a urethane-based resin can be used, for example. In addition, the release film 60 is a film that can be easily separated from the adhesive layer 50, and the laminate 1 (the laminate 1 formed of the resin insulating layer 10, the insulating coating layer 20, the cellulose fiber layer 30, and the carbon nanotube layer 40 according to the third embodiment) can be adhered to a object by separating the release film 60 form the adhesive layer 50.

As described above, the coating member 2 according to the third embodiment is a member for adhering the laminate 1 formed of the resin insulating layer 10, the insulating coating layer 20, and the cellulose fiber layer 30 to the object, and it is possible to easily impart the shielding performance of the laminate 1 to the object.

As described above, the preferred embodiment examples of the present invention have been described, and the technical scope of the present invention is not limited to the descriptions of the above embodiment examples. Various changes/improvements can be made to the above described embodiment examples, and those in which such changes/improvements have been made are also included in the technical scope of the present invention.

For example, in the first to third embodiments described above in where the carbon nanotube layer 40 is the outermost surfaces of the laminates 1 and 1a illustrated in FIGS. 1 and 5, and the coating member 2 illustrated in FIG. 9, a configuration in which the resin insulating layer is further provided on the carbon nanotube layer 40 to prevent carbon fibers of the carbon nanotube from falling off can be adopted within the range that does not exclude the electromagnetic wave absorption property.

Furthermore, in the laminate 1a according to the second embodiment described above, the configuration in which the insulating coating layer 20, the cellulose fiber layer 30, and the carbon nanotube layer 40 are further laminated on the first layer of the carbon nanotube layer 40 is exemplified, but the present invention is not limited to this configuration, and a configuration in which a plurality of layers of the insulating coating layer 20, the cellulose fiber layer 30, and the carbon nanotube layer 40 are laminated according to the desired degree of decrease of the noise (for example, a configuration in which a plurality of layers, such as three layers or four layers, are laminated) may be adopted. In addition, as illustrated in FIGS. 10 and 11, a plurality of the laminates 1 according to the first embodiment may be laminated by interposing the adhesive layer 50 therebetween. For example, a laminate 1b illustrated in FIG. 10 adopts a configuration in which the second layer of the carbon nanotube layer 40 is laminated on the first layer of the carbon nanotube layer 40 by interposing the adhesive layer 50 therebetween, and the cellulose fiber layer 30, the insulating coating layer 20, and the resin insulating layer 10 are laminated thereon in this order. In addition, a laminate 1c illustrated in FIG. 11 adopts a configuration in which the resin insulating layer 10 is further laminated on the first layer of the carbon nanotube layer 40 by interposing the adhesive layer 50 therebetween, and the insulating coating layer 20, the cellulose fiber layer 30, and the carbon nanotube layer 40 are laminated thereon in this order. With these configurations, it is also possible to adjust the noise suppression property at a specific frequency band in addition to being able to enhance the noise suppression effect. In addition, although not illustrated in the figures, a configuration in which a plurality of the laminates 1a according to the second embodiment are laminated by interposing the adhesive layer 50 therebetween can also be adopted.

Furthermore, as an example of lamination for improving the electromagnetic wave absorption property, as illustrated in FIG. 12A, a laminate 1d can be configured as follows: the insulating coating layer 20, the cellulose fiber layer 30, and the carbon nanotube layer 40 are laminated in order on one surface of the resin insulating layer 10 similarly to the laminate 1 according to the first embodiment; and the insulating coating layer 20, the cellulose fiber layer 30, and the carbon nanotube layer 40 are also laminated in order on the opposite surface of the resin insulating layer 10. In addition, as illustrated in FIG. 12B, a laminate 1e can be configured such that two laminates 1d illustrated in FIG. 12A are laminated by interposing the adhesive layer 50 therebetween. In addition, it is also possible to adopt a configuration in which three or more laminates 1d are laminated with the adhesive layer 50.

The invention claimed is:

1. A laminate comprising:
   an insulating layer that mainly contains a resin composition;
   a cellulose fiber layer that is laminated on the insulating layer and mainly contains a microfibrous cellulose having a fiber width of 1000 nm or smaller;
   a carbon nanotube layer that is laminated on the cellulose fiber layer and mainly contains carbon nanotubes; and wherein
   a film thickness of the carbon nanotube layer is 20 µm or smaller, and
   a film thickness of the entire laminate is 120 µm or smaller.

2. The laminate according to claim 1, wherein
   the carbon nanotube layer is formed by using of water-dispersed carbon nanotubes.

3. The laminate according to claim 1, wherein
   a cellulose fiber layer that mainly contains a microfibrous cellulose is further laminated on the carbon nanotube layer, and a carbon nanotube layer that mainly contains carbon nanotubes is further laminated on the cellulose fiber layer.

4. The laminate according to claim 1, wherein
   a second insulating layer that mainly contains a resin composition is laminated on the carbon nanotube layer, a second cellulose fiber layer that mainly contains a microfibrous cellulose is further laminated on the second insulating layer, and a second carbon nanotube layer that mainly contains carbon nanotubes is further laminated on the second cellulose fiber layer.

5. The laminate according to claim 4, wherein
in a case where the second insulating layer is laminated on the carbon nanotube layer, the second insulating layer is formed in a lamination pattern in which the second insulating layer is not laminated on a part of the carbon nanotube layer.

6. The laminate according to claim 1, wherein
the microfibrous cellulose is a cellulose nanofiber having a fiber width of 100 nm or smaller.

7. The laminate according to claim 1, wherein
a film thickness of two layers of the one cellulose fiber layer and the one carbon nanotube layer is 1 to 10 μm.

8. The laminate according to claim 1, wherein
the laminate is used to absorb and reflect a near field electromagnetic wave.

9. The laminate according to claim 1, wherein
the laminate is used to absorb a far field electromagnetic wave.

10. A coating member comprising the laminate according to claim 1.

11. A laminate manufacturing method comprising:
applying a cellulose fiber layer forming material that mainly contains a microfibrous cellulose having a fiber width of 1000 nm or smaller onto an insulating layer forming material that mainly contains a resin composition; and
applying a carbon nanotube layer forming material that mainly contains carbon nanotubes onto the cellulose fiber layer forming material such as a film thickness of a carbon nanotube layer is 20 μm or smaller, and
forming a film thickness of the entire laminate is 120 μm or smaller.

* * * * *